(12) United States Patent
Kang et al.

(10) Patent No.: US 6,833,288 B2
(45) Date of Patent: Dec. 21, 2004

(54) DICING METHOD FOR MICRO ELECTRO MECHNICAL SYSTEM CHIP

(75) Inventors: Joon Seok Kang, Suwon (KR); Sung Cheon Jung, Suwon (KR); Sang Kee Yoon, Suwon (KR); Hyun Kee Lee, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 7 days.

(21) Appl. No.: 10/412,465

(22) Filed: Apr. 11, 2003

(65) Prior Publication Data

US 2004/0005734 A1 Jan. 8, 2004

(30) Foreign Application Priority Data

Jul. 5, 2002 (KR) .......................... 2002-38791

(51) Int. Cl.$^7$ .......................... H01L 21/44; H01L 21/48; H01L 21/50
(52) U.S. Cl. ........................... 438/113; 438/462
(58) Field of Search ................. 438/113, 110, 438/106, 460, 462

(56) References Cited

FOREIGN PATENT DOCUMENTS

JP         02001044142 A  *  2/2001  ......... H01L/21/301

OTHER PUBLICATIONS

Korean Treatise from Korean MEMS conference held Apr. 12, 2002 Proceedings of the 4$^{th}$ Korean Mems Conference.

* cited by examiner

Primary Examiner—Craig A. Thompson
(74) Attorney, Agent, or Firm—Darby & Darby

(57) ABSTRACT

A dicing method for a micro electro mechanical system chip, in which a high yield and productivity of chips can be accomplished, resulting from preventing damage to microstructures during a dicing process by using a protective mask. The dicing method for a micro electro mechanical system chip, comprising the steps of designing a grid line and wafer pattern on a chip-scale on the non-adhesive surface of a transparent tape as a protective mask (first step); sticking microstructure-protecting membranes on the adhesive surface of the transparent tape (second step); putting the transparent tape on the whole surface of a wafer in a state wherein the grid line designed on the non-adhesive surface of the transparent tape is matched to the dicing line of the wafer (third step); cutting the transparent tape to a size larger than the wafer, mounting the wafer on a guide ring and dicing the wafer (fourth step); and separating the transparent tape from diced chips (fifth step).

3 Claims, 3 Drawing Sheets

Cutting line

Removal of protecting membrane cutting line

DICING METHOD FOR MICRO ELECTRO MECHNICAL SYSTEM CHIP

BACKGROUND OF THE INVENTION

1. Field of the Invention

The present invention relates to a dicing method for a micro electro mechanical system chip, and more particularly to a dicing method for a micro electro mechanical system chip, in which damage to microstructures is prevented during a dicing process by using a protective mask.

2. Description of the Related Art

The information society of the 21$^{st}$ century demands the recognition of the peripheral information, utilizing many sensors to measure/analyze in real time. As recent industries follow an information/electronic trend, there is growing demand for sensors to detect physical properties such as pressure, temperature, and speed and chemical properties.

Unfortunately, the current sensors as components have size limitations, quality limitations in terms of function, performance and reliability, and cost reduction limitations. The technology that can overcome these limitations is a high integrated micro sensors-on-chip using Micro Electro-Mechanical System (hereinafter, MEMS).

MEMS sensors, manufactured through semiconductor batch processes can be integrated with signal process circuits on a single chip by on-chip integration, have functions such as self diagnosis, computation and digital signal output, as well as have low cost, high reliability, and micro packaging characteristics. The high integrated micro sensors-on-chip is an integrated micro multi-sensing system that incorporates several MEMS sensors and signal process circuits on a silicon chip. It acts as an information gathering center. The information gathering center gathers and analyzes peripheral information such as physical properties (pressure, speed, position, attitude etc.) and chemical properties, and outputs the needed information.

General MEMS techniques are advantageous in development of low cost, high performance microelements. Therefore, applications to inertial sensors, pressure sensors, biomedical elements and optical communication components have been actively studied.

MEMS-based variable optical attenuators (VOA) and optical switches (OSW) are kinds of optical communication components, in which a barrier and an actuator fabricated by bulk micro machining technology serve to attenuate the quantity of light and switch an optical path between two optical fibers, i.e., a transmitter optical fiber and a receiver optical fiber aligned on a chip in a straight line. Like the MEMS VOA, in case of optical MEMS elements, precise alignment of optical fibers on a chip is important. Therefore, the optical MEMS elements require high aspect ratio structures to ensure precise alignment between optical fiber core and chip structures.

FIG. 1 is a cross sectional view of conventional high aspect ratio MEMS structures and FIG. 2 is a microphotograph of MEMS structures damaged during a dicing process.

In a conventional semiconductor manufacturing process, there are no MEMS microstructures on the surface of a wafer. In this respect, the wafer is mounted on a guide ring, sprayed with cooling water and diced during a high-speed rotation of a dicing blade.

In the case where a dicing method used in the conventional semiconductor manufacturing process is applied to optical MEMS structures requiring high aspect ratio structures as shown in FIG. 1, the structures are liable to be damaged due to water pressure of cooling water required for absorbing heat generated during dicing and air currents generated about a high-speed rotating dicing blade, as shown in FIG. 2.

Optical MEMS elements require direct alignment with optical fibers on a chip. Therefore, microstructures are directly exposed to cooling water and air currents during dicing and thus readily damaged. As a result, the yield of chips is undesirably lowered.

To solve the above problem, a dicing process was proposed in which a wafer is cut and separated into discrete chips using a fan-shaped diamond blade cutter.

In this case, however, there are problems in that accurate control of the cutting direction with respect to the crystal axis of a wafer is required and a large amount of foreign substances are generated in the cutting process.

SUMMARY OF THE INVENTION

Therefore, the present invention has been made in view of the above problems, and it is an object of the present invention to provide a dicing method for a micro electro mechanical system chip, in which a high yield and productivity of chips can be accomplished, resulting from preventing damage to microstructures during a dicing process by using a protective mask.

In accordance with one aspect of the present invention, the above object and other objects can be accomplished by the provision of a dicing method for a micro electro mechanical system chip, comprising the steps of designing a grid line and wafer pattern on a chip-scale on the non-adhesive surface of a transparent tape as a protective mask (first step); sticking microstructure-protecting membranes on the adhesive surface of the transparent tape (second step); putting the transparent tape on the whole surface of a wafer in a state wherein the grid line designed on the non-adhesive surface of the transparent tape is matched to the dicing line (or hairline) of the wafer (third step); cutting the transparent tape to a size larger than the wafer, mounting the wafer on a guide ring and dicing the wafer (fourth step); and separating the transparent tape from diced chips (fifth step).

Preferably, in the second step, the microstructure-protecting membrane may be a non-adhesive vinyl free from foreign substances.

Further preferably, in the second step, the size of the microstructure-protecting membrane may be sufficient to ensure that the membrane sufficiently protects microstructures, is smaller than a chip, and prevents the separation of the transparent tape from the wafer during dicing.

BRIEF DESCRIPTION OF THE DRAWINGS

The above object and other objects, features and other advantages of the present invention will be more clearly understood from the following detailed description taken in conjunction with the accompanying drawings, in which.

DESCRIPTION OF THE PREFERRED EMBODIMENTS

Hereinafter, one preferable embodiment of the present invention will be described in more detail by way of the accompanying figures.

FIGS. 3 to 7 illustrate a dicing process for a MEMS chip of the present invention.

A dicing method for a MEMS chip will be described with reference to FIGS. 3 to 7.

Figure 1:
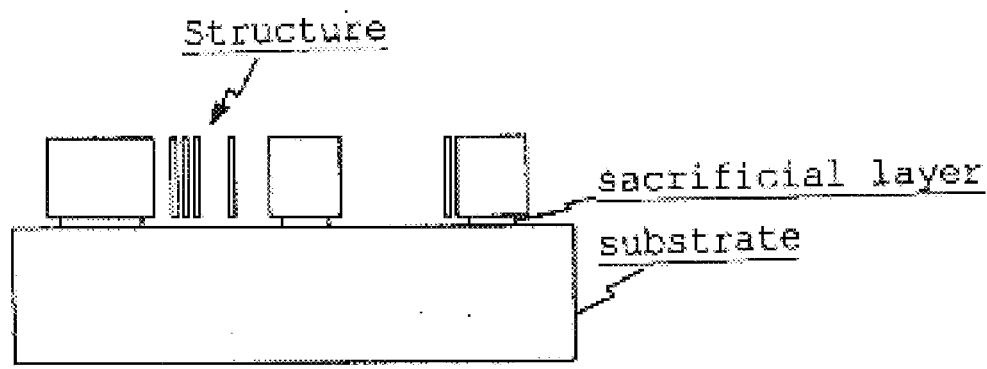
FIG. 1 is a cross sectional view of high aspect ratio MEMS structures.
Figure 2:
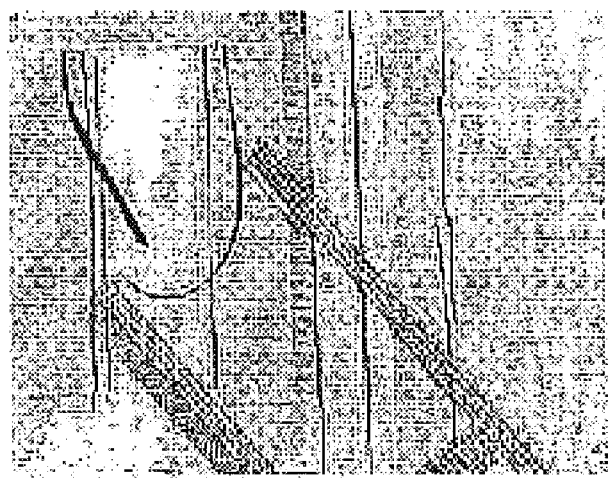
FIG. 2 is a microphotograph of MEMS structures damaged during a dicing process.
Figure 3:
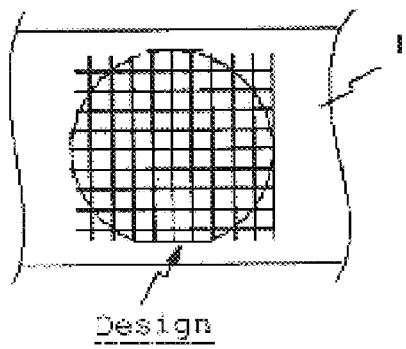
FIGS. 3 to 7 illustrate a dicing process for a MEMS chip according to the present invention.

First, a grid line and wafer pattern are designed on a chip-scale on the non-adhesive surface of a transparent tape 1 as a protective mask, as shown in FIG. 3.

Figure 4:
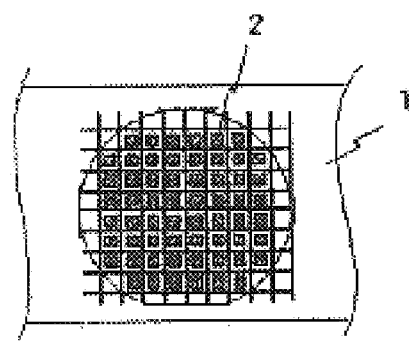

Microstructure-protecting membranes 2 are stuck on the adhesive surface of the transparent tape 1, as shown in FIG. 4.

In this case, a non-adhesive vinyl free from foreign substances is used as a microstructure-protecting membrane 2 material. The size of the microstructure-protecting membrane 2 is sufficient to ensure that the membrane sufficiently protects the microstructures, is smaller than a chip, and prevents the separation of the transparent tape 1 from a wafer during dicing. This is because if the transparent tape 1 as a protective mask is separated from the wafer during dicing, the microstructures are subjected to an external pressure. If the transparent tape 1 is not separated from the wafer until the completion of the dicing process, contamination of chips by foreign substances generated during dicing can be prevented.

Figure 5:
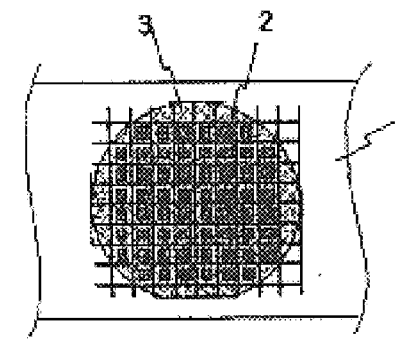

The transparent tape 1 is put on the whole surface of the wafer 3 in a state wherein the grid line designed on the non-adhesive surface of the transparent tape 1 is matched to the dicing line of the wafer, as shown in FIG. 5.

In this case, in order for the adhesive of the transparent tape 1 not to affect microstructures, it is preferable to remove the adhesive on a certain portion of the transparent tape and then to put the transparent tape on the wafer. The microstructure-protecting membrane 2 is also used for this purpose.

Figure 6:
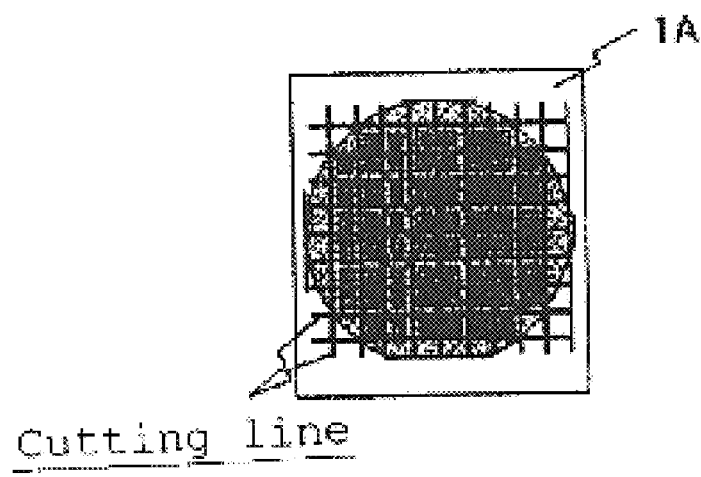

The transparent tape 1 is cut to a size larger than a wafer (cut transparent tape; indicated as a reference numeral 1A), the wafer 3 is mounted on a guide ring and diced along a cutting line, as shown in FIG. 6.

Figure 7:
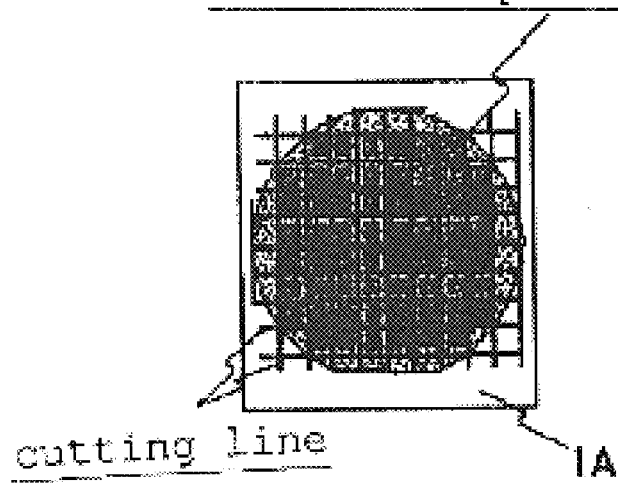

The transparent tape is separated from diced chips, as shown in FIG. 7.

Consequently, according to the present invention, an adhesive transparent tape is put on the whole surface of a wafer to thereby protect microstructures on the wafer and then the wafer is diced, so that damage to the microstructures caused by an external pressure during dicing is prevented.

After a dicing process, where a transparent tape as a protective mask is separated from diced chips as shown in FIG. 7, it is important that microstructures does not adhere to the transparent tape, thereby damage to the microstructures being prevented.

As apparent from the above description, the present invention provides a dicing method for a micro electro mechanical system chip, in which the use of a protective mask makes it possible to prevent damage to microstructures, resulting in improving the yield of optical MEMS products in manufacturing the MEMS products requiring high aspect ratio (HAR) structures and contributing to mass production of the MEMS products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A dicing method for a micro electro mechanical system chip, comprising the steps of:

designing a grid line and wafer pattern on a chip-scale on the non-adhesive surface of a transparent tape as a protective mask (first step);

sticking microstructure-protecting membranes on the adhesive surface of the transparent tape (second step);

putting the transparent tape on the whole surface of a wafer in a state wherein the grid line designed on the non-adhesive surface of the transparent tape is matched to the dicing line of the wafer (third step);

cutting the transparent tape to a size larger than the wafer, mounting the wafer on a guide ring and dicing the wafer (fourth step); and separating the transparent tape from diced chips (fifth step).

2. The dicing method as set forth in claim 1, wherein in the second step, the microstructure-protecting membrane is a non-adhesive vinyl free from foreign substances.

3. The dicing method as set forth in claim 1, wherein in the second step, the size of the microstructure-protecting membrane is sufficient to ensure that the membrane sufficiently protects microstructures, is smaller than a chip, and prevents the separation of the transparent tape from the wafer during dicing.

* * * * *